(12) United States Patent
Koakutsu

(10) Patent No.: US 9,722,119 B2
(45) Date of Patent: Aug. 1, 2017

(54) SOLAR CELL PANEL

(75) Inventor: Hideaki Koakutsu, Tokyo (JP)

(73) Assignee: MITSUBISHI DENKI KABUSHIKI KAISHA, Tokyo (JP)

( * ) Notice: Subject to any disclaimer, the term of this patent is extended or adjusted under 35 U.S.C. 154(b) by 1880 days.

(21) Appl. No.: 10/508,539

(22) PCT Filed: Feb. 5, 2004

(86) PCT No.: PCT/JP2004/001200
§ 371 (c)(1),
(2), (4) Date: Sep. 27, 2004

(87) PCT Pub. No.: WO2004/073074
PCT Pub. Date: Aug. 26, 2004

(65) Prior Publication Data
US 2005/0166954 A1   Aug. 4, 2005

(30) Foreign Application Priority Data

Feb. 12, 2003 (JP) .................................. 2003-033735

(51) Int. Cl.
*H01L 31/042* (2014.01)
*H01L 31/05* (2014.01)

(52) U.S. Cl.
CPC .......... *H01L 31/0504* (2013.01); *Y02E 10/50* (2013.01)

(58) Field of Classification Search
CPC ........................... H01L 31/0504; Y02E 10/50
USPC ................................................. 136/243–293
See application file for complete search history.

(56) References Cited

U.S. PATENT DOCUMENTS

| | | | | |
|---|---|---|---|---|
| 4,019,924 A | * | 4/1977 | Kurth | 136/251 |
| 4,084,985 A | * | 4/1978 | Evans, Jr. | 136/251 |
| 4,131,123 A | | 12/1978 | Della-Vedowa et al. | |
| 4,409,537 A | * | 10/1983 | Harris | 136/244 |
| 4,567,316 A | * | 1/1986 | Hollaus et al. | 136/246 |
| 5,688,337 A | * | 11/1997 | Mosher | 136/244 |
| 6,248,950 B1 | * | 6/2001 | Hoeber et al. | 136/251 |
| 6,331,671 B1 | * | 12/2001 | Makita et al. | 136/244 |
| 6,350,944 B1 | | 2/2002 | Sherif et al. | |
| 6,903,260 B2 | * | 6/2005 | Boulanger | 136/244 |
| 2004/0112419 A1 | * | 6/2004 | Boulanger | 136/244 |

FOREIGN PATENT DOCUMENTS

| | | | | |
|---|---|---|---|---|
| JP | 06-275857 | * | 9/1994 | .......... H01L 31/042 |
| JP | 10-319851 | | 12/1998 | |
| JP | 11-274542 | | 10/1999 | |
| JP | 2000-91617 | | 3/2000 | |
| JP | 2001-267617 | | 9/2001 | |
| WO | 00/14849 | | 3/2000 | |
| WO | WO 02/074623 A1 | | 9/2002 | |

OTHER PUBLICATIONS

English translation of JP 06-275857.*

* cited by examiner

*Primary Examiner* — Thanh-Truc Trinh
(74) *Attorney, Agent, or Firm* — Oblon, McClelland, Maier & Neustadt, L.L.P.

(57) ABSTRACT

A plurality of solar cell assembly series of a solar cell panel are so arranged that any two adjacent solar cells in the plurality of solar cell assembly series have a potential difference which does not exceed V volts which is a maximum output voltage of the plurality of solar cell assembly series.

1 Claim, 5 Drawing Sheets

SOLAR CELL PANEL

FIELD OF THE INVENTION

The present invention relates to a solar cell panel for use in spacecrafts, such as satellites and airships. More particularly, it relates to a solar cell array and a solar cell panel structure that can prevent electrical discharges from occurring between any solar cells.

BACKGROUND OF THE INVENTION

In the past, many spacecrafts carrying a solar cell panel have been lofted into space. As spacecrafts become more sophisticated in functionality, solar cell panels which can supply high power to spacecrafts are needed. The need to raise the output voltages of solar cell panels has therefore arisen from this necessity for the supply of high power. Since the potential difference between solar cells in a solar cell panel becomes large with increase in the output voltage of the solar cell panel, an electric discharge which originates from power generated by the solar cells which is an energy source can easily occur between the solar cells.

A prior art solar cell panel in which an insulating material, such as an RTV adhesive, is filled into the gap between solar cells in the solar cell panel and is used as an insulating barrier is known as a measure for preventing an electric discharge from occurring between the solar cells (refer to patent reference 1, for example).

[Patent Reference 1] Japanese patent application publication No. 11-274,542 (see FIGS. 11 and 18)

The prior art solar cell panel in which an insulating material, such as an RTV adhesive, is placed in the gap between solar cells in the solar cell panel and is used as an insulating barrier has the following problems. The first problem is that the prior art solar cell panel increases in weight by only the weight of the adhesive which is used as the insulating barrier. The second problem is that the prior art solar cell panel increases in cost because of increase in the material cost of the adhesive which is used as the insulating barrier, the cost of installing the insulating barrier, increase in the cost of launching a rocket, and so on.

According to patent reference 1, since any two adjacent solar cell assembly series are so connected as to have different gradient directions in their potentials with respect to a folded connection point therebetween, any two adjacent solar cells in any two adjacent solar cell assembly series have a minimum potential difference of 0 volts at their lowermost ends and a maximum potential difference of 2V volts at their uppermost ends when each solar cell assembly series has a potential difference of V volts. The uppermost ends of any two adjacent solar cell assembly series having the maximum potential difference are at increased risk of causing electrostatic discharges.

The smaller potential difference solar cells have, the lower risk of causing electric discharges between the solar cells. When there is no insulating barrier between any solar cells, an adequate margin of safety can be provided against electric discharges if the voltages of solar cells are reduced to ½ or less of original ones, as compared with a case where an insulating barrier is provided between any solar cells (refer to paragraph number (0049) of patent reference 1). Therefore, implementation of an arrangement of solar cells which can reduce the potential difference between any two adjacent solar cells is effective in preventing electric discharges from occurring between any solar cells.

The present invention is made in order to solve the above-mentioned problems, and it is therefore an object of the present invention to provide a solar cell panel that can prevent electric discharges from occurring between any solar cells without installing an insulating barrier in the gap between any solar cells.

It is another object of the present invention to provide a solar cell panel in which the potential difference between any two adjacent solar cells is reduced to less than 2V volts in the prior art even when installing an insulating barrier into the gap between any two solar cells, thereby providing a more adequate margin of safety against electric discharges between solar cells as compared with prior art solar cell panels.

DISCLOSURE OF THE INVENTION

In accordance with a first aspect of the present invention, there is provided a solar cell panel including: a plurality of solar cell assembly series each including a plurality of solar cells and interconnectors each for electrically connecting between two of these solar cells in series, said plurality of solar cells being arranged substantially in a line and any two of said plurality of solar cells being electrically connected in series by one of said interconnectors; an insulator on which said plurality of solar cell assembly series are arranged at predetermined gaps; and connection lines that electrically connect said plurality of adjacent solar cell assembly series so that they are connected in series, said plurality of solar cell assembly series being arranged so that they have an identical gradient direction in their potentials.

In accordance with a second aspect of the present invention, there is provided a solar cell panel including: a plurality of solar cell assembly series each including a plurality of solar cells and interconnectors each for electrically connecting between two of these solar cells in series, said plurality of solar cells being arranged substantially in a line and any two of said plurality of solar cells being electrically connected in series by one of said interconnectors; an insulator on which said plurality of solar cell assembly series are arranged at predetermined gaps; first connection lines that electrically connect some of said plurality of solar cell assembly series so that they are connected in series so as to form a first solar cell string; and second connection lines that electrically connect remaining ones of said plurality of solar cell assembly series so that they are connected in series so as to form a second solar cell string, the solar cell assembly series of said first solar cell string and the solar cell assembly series of said second solar cell string being arranged so that they are surely adjacent to one another.

As a result, electric discharges can be prevented from occurring between any solar cells in the solar cell panel without installing an insulating barrier into the gap between any solar cells. In addition, when installing an insulating barrier into the gap between any solar cells, a more adequate margin of safety can be provided against electric discharges between solar cells as compared with prior art solar cell panels.

PREFERRED EMBODIMENTS OF THE INVENTION

Hereafter, in order to explain this invention in greater detail, the preferred embodiments of the present invention will be described with reference to the accompanying drawings.

Embodiment 1

Figure 1:
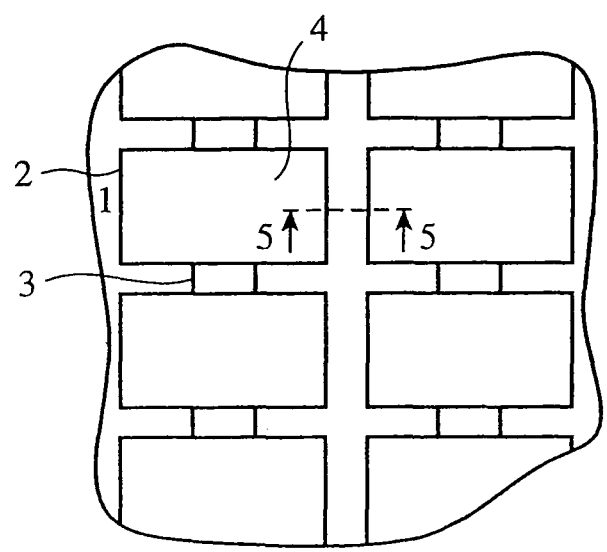
FIG. 1 is a plan view of each of embodiments 1 to 4 of the present invention.

FIG. 1 is a plan view showing embodiment 1 of the present invention. In FIG. 1, solar cells 2 are secured to a surface of an insulator 1. Interconnectors 3 are connected to each of the solar cells 2, and a cover glass 4 is bonded to each of the solar cells 2.

Figure 2:
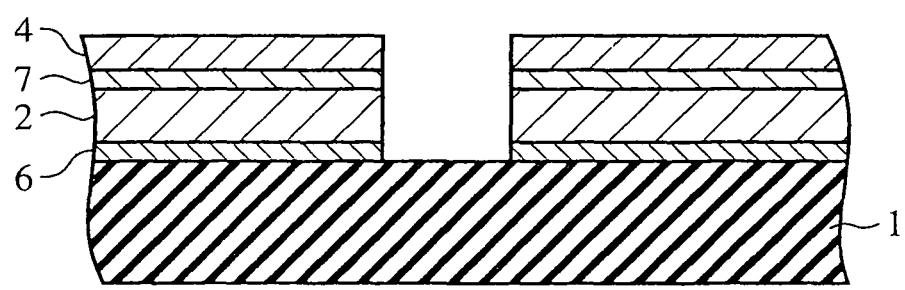
FIG. 2 is a diagram showing a cross section in FIG. 1.

FIG. 2 is a cross-sectional view showing a cross section of FIG. 1 taken along the line 5-5.

As shown in FIG. 2, each solar cell 2 is secured to the surface of the insulator 1 by an adhesive 6, and the cover glass 4 is secured to the light receiving surface of each solar cell 2 by an adhesive 7.

In FIGS. 1 and 2, wiring for connecting among solar cell assembly series is not shown.

Figure 3:
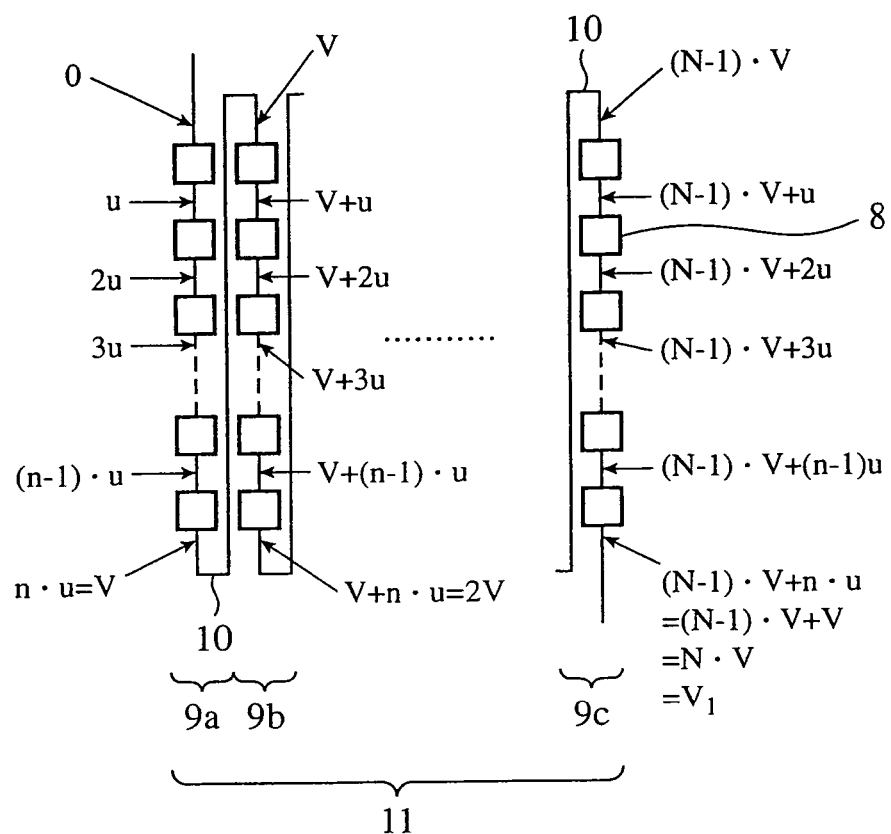
FIG. 3 is a diagram of solar cell circuitry according to embodiment 1 of the present invention.

FIG. 3 is a diagram showing the structure of solar cell circuitry according to embodiment 1 of the present invention.

In FIG. 3, n solar cell assemblies 8 each having a maximum output voltage u are arranged substantially in a line so that each solar cell assembly series 9 is constructed. Each solar cell assembly series 9 has a maximum output voltage V=n*u. Furthermore, N solar cell assembly series 9 are electrically connected in series by way of connection lines 10 so that a solar cell string 11 is constructed. The solar cell string 11 has a maximum output voltage $V_1$=N*V equal to the total sum of the maximum output voltages of the plurality of solar cell assembly series electrically connected in series.

In the solar cell panel constructed as mentioned above, the last solar cell assembly of the first solar cell assembly series 9a which is located at the lowermost end thereof shown in the figure is electrically connected in series with the first solar cell assembly of the second solar cell assembly series 9b which is located at the uppermost end thereof shown in the figure by a connection line 10. Therefore, since the solar cells in the first solar cell assembly series 9a which are running from the uppermost end thereof shown in the figure have respective potentials u, 2u, . . . , (n−1)*u, and n*u, and the solar cells in the second solar cell assembly series 9b which are running from the uppermost end thereof shown in the figure have respective potentials V+u, V+2u, . . . , V+(n−1)*u, and v+n*u, any two adjacent solar cells in the first and second solar cell assembly series can have a potential difference which does not exceed V.

Then, connections among solar cell assembly series including up to the Nth solar cell assembly series 9c are repeatedly carried out. Thus, the plurality of solar cell assembly series are arranged so that they have an identical gradient direction in their potentials in the solar cell string. Conventionally, any two adjacent solar cells have a maximum potential difference of 2V volts. In contrast, in accordance with this embodiment, the potential difference between any two adjacent solar cells in any two adjacent solar cell assembly series is greatly reduced to V volts which is the maximum output voltage of each solar cell assembly series or less.

As a result, electric discharges can be prevented from occurring between any solar cells in the solar cell panel. The weight of the solar cell panel can be reduced, the efficiency of mounting solar cells in the solar cell panel can be increased, and the cost of the solar cell panel can be reduced. In addition, when installing an insulating barrier into the gap between any two solar cells, an adequate margin of safety can be provided against electric discharges between solar cells as compared with prior art solar cell panels.

Embodiment 2

FIG. 1 is a plan view showing embodiment 2 of the present invention. FIG. 2 is a cross-sectional view showing a cross section of FIG. 1 taken along the line 5-5.

Figure 4:
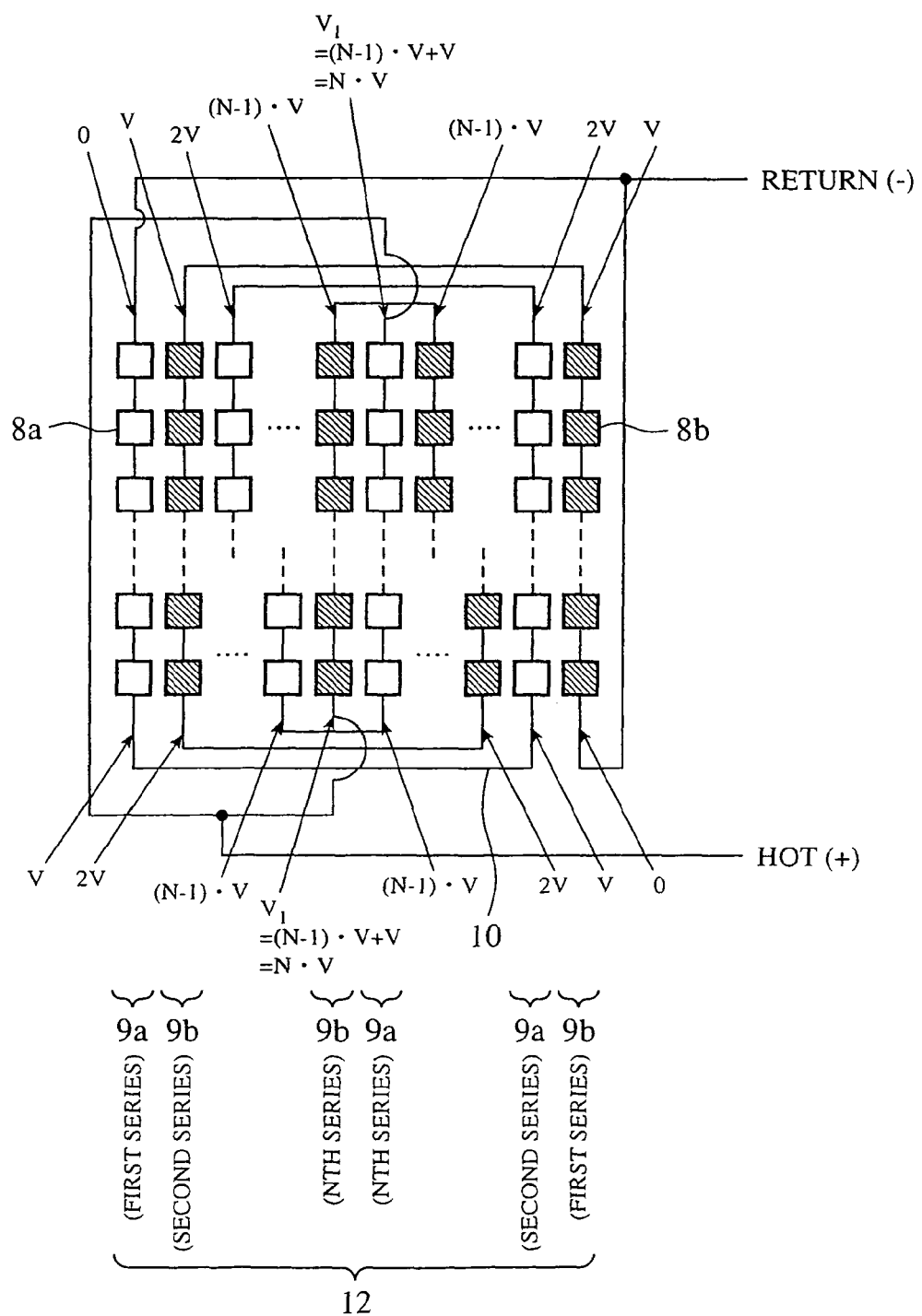
FIG. 4 is a diagram of solar cell circuitry according to embodiment 2 of the present invention.

FIG. 4 is a diagram showing solar cell circuitry according to embodiment 2 of the present invention.

In FIG. 4, n solar cell assemblies 8a each having a maximum output voltage u are arranged substantially in a line so that each solar cell assembly series 9a is constructed. Each solar cell assembly series 9a has a maximum output voltage V=n*u.

Furthermore, N solar cell assembly series 9a are electrically connected in series by way of connection lines 10 so that a solar cell string 11a is constructed. Similarly, n solar cell assemblies 8b each having a maximum output voltage u are arranged substantially in a line so that each solar cell assembly series 9b is constructed. Each solar cell assembly series 9b has a maximum output voltage V=n*u.

Furthermore, N solar cell assembly series 9b are electrically connected in series by way of connection lines 10 so that a solar cell string 11b is constructed. The solar cell string 11a and the solar cell string 11b are connected in parallel so that a solar cell module 12 is constructed.

The first series of the N solar cell assembly series 9a is arranged at the leftmost end of the solar cell module, and the first series of the N solar cell assembly series 9b is arranged at the rightmost end of the solar cell module. The first series of the N solar cell assembly series 9a is so arranged as to have a direction of potential difference between 0 volts at its uppermost end and V volts at its lowermost end, and the first series of the N solar cell assembly series 9b is so arranged as to have a direction of potential difference between 0 volts at its lowermost end and V volts at its uppermost end.

In the solar cell panel constructed as mentioned above, the first series of the N solar cell assembly series 9a and the second series of the N solar cell assembly series 9b are so arranged as to be adjacent to each other. Therefore, since the solar cells in the first solar cell assembly series 9a which are running from the uppermost end thereof shown in the figure have respective potentials u, 2u, . . . , (n−1)*u, and n*u, and the solar cells in the second solar cell assembly series 9b which are running from the uppermost end thereof shown in the figure have respective potentials V+u, V+2u, . . . , V+(n−1)*u, and V+n*u, any two adjacent solar cells in the first solar cell assembly series 9a and the second solar cell assembly series 9b can have a potential difference which does not exceed V.

Similarly, any other solar cell assembly series 9a which constitutes the solar cell string 11a in the solar cell module and a corresponding solar cell assembly series 9b which constitutes the other solar cell string 11b connected in parallel with the solar cell string 11a are so arranged as to be adjacent to each other. Conventionally, any two adjacent solar cells have a maximum potential difference of 2V volts. In contrast, in accordance with this embodiment, the potential difference between any two adjacent solar cells in any two adjacent solar cell assembly series is greatly reduced to V volts which is the maximum output voltage of each solar cell assembly series or less.

As a result, electric discharges can be prevented from occurring between any solar cells in the solar cell panel. The weight of the solar cell panel can be reduced, the efficiency of mounting solar cells in the solar cell panel can be increased, and the cost of the solar cell panel can be reduced. In addition, when installing an insulating barrier into the gap between any two solar cells, an adequate margin of safety can be provided against electric discharges between solar cells as compared with prior art solar cell panels.

Embodiment 3

FIG. 1 is a plan view showing embodiment 3 of the present invention. FIG. 2 is a cross-sectional view showing a cross section of FIG. 1 taken along the line 5-5.

Figure 5:
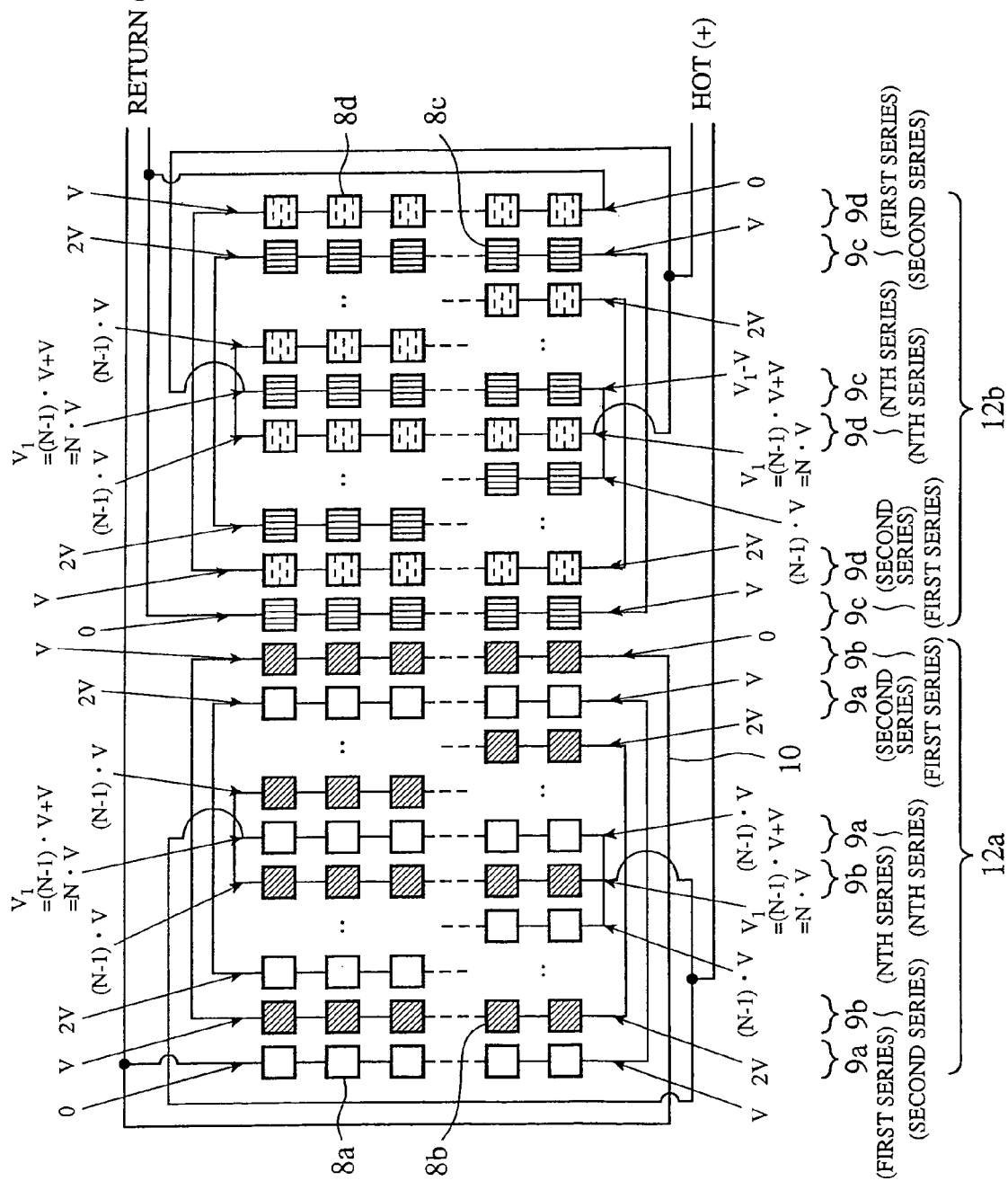
FIG. 5 is a diagram of solar cell circuitry according to embodiment 3 of the present invention.

FIG. 5 is a diagram showing solar cell circuitry according to embodiment 3 of the present invention.

In FIG. 5, n solar cell assemblies 8a each having a maximum output voltage u are arranged substantially in a line so that each solar cell assembly series 9a is constructed. Each solar cell assembly series 9a has a maximum output voltage V=n*u. Furthermore, N solar cell assembly series 9a are electrically connected in series by way of connection lines 10 so that a solar cell string 11a is constructed.

Similarly, n solar cell assemblies 8b each having a maximum output voltage u are arranged substantially in a line so that each solar cell assembly series 9b is constructed. Each solar cell assembly series 9b has a maximum output voltage V=n*u. Furthermore, N solar cell assembly series 9b are electrically connected in series by way of connection lines 10 so that a solar cell string 11b is constructed. The solar cell string 11a and the solar cell string 11b are connected in parallel so that a solar cell module 12a is constructed.

In addition, n solar cell assemblies 8c each having a maximum output voltage u are arranged substantially in a line so that each solar cell assembly series 9c is constructed. Each solar cell assembly series 9c has a maximum output voltage V=n*u. Furthermore, N solar cell assembly series 9c are electrically connected in series by way of connection lines 10 so that a solar cell string 11c is constructed.

Similarly, n solar cell assemblies 8d each having a maximum output voltage u are arranged substantially in a line so that each solar cell assembly series 9d is constructed. Each solar cell assembly series 9d has a maximum output voltage V=n*u. Furthermore, N solar cell assembly series 9d are electrically connected in series by way of connection lines 10 so that a solar cell string 11d is constructed. The solar cell string 11c and the solar cell string 11d are connected in parallel so that a solar cell module 12b is constructed.

In the solar cell panel constructed as mentioned above, the first series of the N solar cell assembly series 9a and the second series of the N solar cell assembly series 9b are so arranged as to be adjacent to each other. Therefore, since the solar cells in the first series of the N solar cell assembly series 9a which are running from the uppermost end thereof shown in the figure have respective output potentials u, 2u, (n−1)*u, and n*u, and the solar cells in the second series of the N solar cell assembly series 9b which are running from the uppermost end thereof shown in the figure have respective output potentials V+u, V+2u, . . . , V+(n−1)*u, and V+n*u, any two adjacent solar cells in the first series of the N solar cell assembly series 9a and the second series of the N solar cell assembly series 9b can have a potential difference which does not exceed V.

Similarly, any other solar cell assembly series 9a which constitutes the solar cell string 11a in the solar cell module 12a and a corresponding solar cell assembly series 9b which constitutes the other solar cell string 11b connected in parallel with the solar cell string 11a are so arranged as to be adjacent to each other. Therefore, any two adjacent solar cells in any two adjacent solar cell assembly series 9a and 9b in the solar cell module 12a can have a potential difference which does not exceed V.

In addition, the first series of the N solar cell assembly series 9c and the second series of the N solar cell assembly series 9d are so arranged as to be adjacent to each other. Therefore, since the solar cells in the first series of the N solar cell assembly series 9c which are running from the uppermost end thereof shown in the figure have respective output potentials u, 2u, . . . , (n−1)*u, and n*u, and the solar cells in the second series of the N solar cell assembly series 9d which are running from the uppermost end thereof shown in the figure have respective output potentials V+u, V+2u, . . . , V+(n−1)*u, and V+n*u, any two adjacent solar cells in the first series of the N solar cell assembly series 9c and the second series of the N solar cell assembly series 9d can have a potential difference which does not exceed V.

Similarly, any other solar cell assembly series 9c which constitutes the solar cell string 11c in the solar cell module 12b and a corresponding solar cell assembly series 9d which constitutes the other solar cell string 11d connected in parallel with the solar cell string 11c are so arranged as to be adjacent to each other. Therefore, any two adjacent solar cells in any two adjacent solar cell assembly series 9c and 9d in the solar cell module 12b can have a potential difference which does not exceed V.

The solar cell module 12a and the solar cell module 12b are so arranged that they are point symmetric to each other with respect to a center of a boundary line between the solar cell module 12a and the solar cell module 12b, Therefore, since the first series of the N solar cell assembly series 9b and the first series of the N solar cell assembly series 9c are so arranged they are point symmetric to each other with respect to the center of the boundary line, the solar cells in the first series of the N solar cell assembly series 9b which are running from the uppermost end thereof shown in the figure have respective output potentials n*u, (n−1)*u, . . . , 2*u, and u, and the solar cells in the first series of the N solar cell assembly series 9c which are running from the uppermost end thereof shown in the figure have respective output potentials u, 2u, . . . , (n−1)*u, and n*u. Therefore, the maximum potential of the solar cell assembly series within each solar cell module, which is arranged adjacent to the other solar cell module, can be reduced to the maximum output voltage V of each solar cell assembly series or less.

Thus, even if the output voltage of each solar cell module changes in a range from 0 volts to the maximum output voltage $V_1$ according to control by a power control circuit, the potential difference between any two adjacent solar cells in any two solar cell assembly series of the solar cell panel, as well as the potential difference between the two adjacent solar cell modules, can be always reduced to the maximum output voltage V of each solar cell assembly series or less.

As a result, electric discharges can be prevented from occurring between any solar cells in the solar cell panel. The weight of the solar cell panel can be reduced, the efficiency of mounting solar cells in the solar cell panel can be increased, and the cost of the solar cell panel can be reduced. In addition, when installing an insulating barrier into the gap between any two solar cells, an adequate margin of safety can be provided against electric discharges between solar cells as compared with prior art solar cell panels.

Embodiment 4

FIG. 1 is a plan view showing embodiment 4 of the present invention. FIG. 2 is a cross-sectional view showing a cross section of FIG. 1 taken along the line 5-5.

Figure 6:
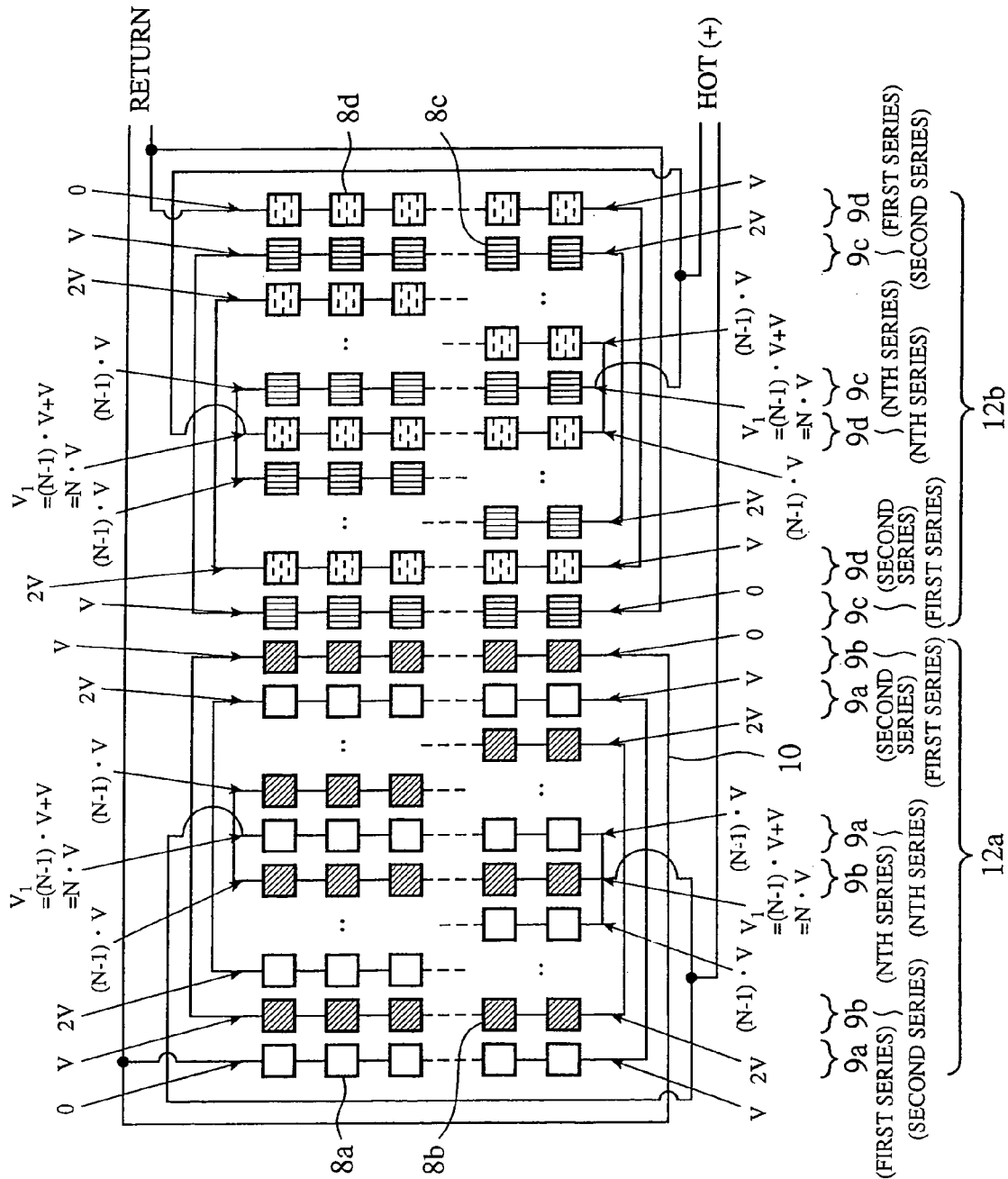
FIG. 6 is a diagram of solar cell circuitry according to embodiment 4 of the present invention.

FIG. 6 is a diagram showing solar cell circuitry according to embodiment 4 of the present invention.

In FIG. 6, n solar cell assemblies 8a each having a maximum output voltage u are arranged substantially in a line so that each solar cell assembly series 9a is constructed. Each solar cell assembly series 9a has a maximum output voltage V=n*u. Furthermore, N solar cell assembly series 9a are electrically connected in series by way of connection lines 10 so that a solar cell string 11a is constructed.

Similarly, n solar cell assemblies 8b each having a maximum output voltage u are arranged substantially in a line so that each solar cell assembly series 9b is constructed. Each solar cell assembly series 9b has a maximum output voltage V=n*u. Furthermore, N solar cell assembly series 9b are electrically connected in series by way of connection lines 10 so that a solar cell string 11b is constructed. The solar cell string 11a and the solar cell string 11b are connected in parallel so that a solar cell module 12a is constructed.

In addition, n solar cell assemblies 8c each having a maximum output voltage u are arranged substantially in a line so that each solar cell assembly series 9c is constructed. Each solar cell assembly series 9c has a maximum output voltage V=n*u. Furthermore, N solar cell assembly series 9c are electrically connected in series by way of connection lines 10 so that a solar cell string 11c is constructed.

Similarly, n solar cell assemblies 8d each having a maximum output voltage u are arranged substantially in a line so that each solar cell assembly series 9d is constructed. Each solar cell assembly series 9d has a maximum output voltage V=n*u. Furthermore, N solar cell assembly series 9d are electrically connected in series by way of connection lines 10 so that a solar cell string 11d is constructed. The solar cell string 11c and the solar cell string 11d are connected in parallel so that a solar cell module 12b is constructed.

In the solar cell panel constructed as mentioned above, the first series of the N solar cell assembly series 9a and the second series of the N solar cell assembly series 9b are so arranged as to be adjacent to each other. Therefore, since the solar cells in the first series of the N solar cell assembly series 9a which are running from the uppermost end thereof shown in the figure have respective output potentials u, 2u, (n−1)*u, and n*u, and the solar cells in the second series of the N solar cell assembly series 9b which are running from the uppermost end thereof shown in the figure have respective output potentials V+u, V+2u, . . . , V+(n−1)*u, and V+n*u, any two adjacent solar cells in the first series of the N solar cell assembly series 9a and the second series of the N solar cell assembly series 9b can have a potential difference which does not exceed V.

Similarly, any other solar cell assembly series 9a which constitutes the solar cell string 11a in the solar cell module 12a and a corresponding solar cell assembly series 9b which constitutes the other solar cell string 11b connected in parallel with the solar cell string 11a are so arranged as to be adjacent to each other. Therefore, any two adjacent solar cells in any two adjacent solar cell assembly series 9a and 9b in the solar cell module 12a can have a potential difference which does not exceed V.

In addition, the first series of the N solar cell assembly series 9c and the second series of the N solar cell assembly series 9d are so arranged as to be adjacent to each other. Therefore, since the solar cells in the first series of the N solar cell assembly series 9c which are running from the uppermost end thereof shown in the figure have respective output potentials u, 2u, . . . , (n−1)*u, and n*u, and the solar cells in the second series of the N solar cell assembly series 9d which are running from the uppermost end thereof shown in the figure have respective output potentials V+u, V+2u, . . . , V+(n−1)*u, and V+n*u, any two adjacent solar cells in the first series of the N solar cell assembly series 9c and the second series of the N solar cell assembly series 9d can have a potential difference which does not exceed V.

Similarly, any other solar cell assembly series 9c which constitutes the solar cell string 11c in the solar cell module 12b and a corresponding solar cell assembly series 9d which constitutes the other solar cell string 11d connected in parallel with the solar cell string 11c are so arranged as to be adjacent to each other. Therefore, any two adjacent solar cells in any two adjacent solar cell assembly series 9c and 9d in the solar cell module 12b can have a potential difference which does not exceed V.

In addition, the solar cell module 12a and the solar cell module 12b are so arranged that they are line symmetric to each other with respect to a boundary line between the solar cell module 12a and the solar cell module 12b, Therefore, since the first series of the N solar cell assembly series 9b and the first series of the N solar cell assembly series 9c are so arranged they are line symmetric to each other with respect to the boundary line, the solar cells in the first series of the N solar cell assembly series 9b which are running from the uppermost end thereof shown in the figure have respective output potentials n*u, (n−1)*u, . . . , 2*u, and u, and the solar cells in the first series of the N solar cell assembly series 9c which are running from the uppermost end thereof shown in the figure have respective output potentials n*u, (n−1)*u, . . . , 2*u, and u. The solar cell assembly series within one solar cell module is therefore arranged at a potential difference of 0 volts with its neighboring solar cell assembly series within the other solar cell module.

Thus, even if the output voltage of each solar cell module changes in a range from 0 volts to the maximum output voltage $V_1$ according to control by a power control circuit, the potential difference between any two adjacent solar cells in any two solar cell assembly series of the solar cell panel, as well as the potential difference between the two adjacent solar cell modules, can be always reduced to the maximum output voltage V of each solar cell assembly series or less.

In addition, since the solar cell assembly series pattern of the solar cell module 12a has line symmetry with respect to the solar cell assembly series pattern of the solar cell module 12b, the magnetic field caused by one of the two solar cell modules can be canceled by the magnetic field caused by the other solar cell module.

As a result, electric discharges can be prevented from occurring between any solar cells in the solar cell panel. The weight of the solar cell panel can be reduced, the efficiency of mounting solar cells in the solar cell panel can be increased, and the cost of the solar cell panel can be reduced. In addition, when installing an insulating barrier into the gap between any two solar cells, an adequate margin of safety can be provided against electric discharges between solar cells as compared with prior art solar cell panels.

INDUSTRIAL APPLICABILITY

As mentioned above, the solar cell panel according to the present invention is suitable for use in spacecrafts, such as satellites and airships.

The invention claimed is:
1. A solar cell panel comprising:
at least one solar cell module including:
a plurality of solar cell assembly series, each solar cell assembly series including a plurality of solar cells and interconnectors each for electrically connecting between two of the plurality of solar cells in the plurality of solar cell assembly series, said plurality of solar cells being arranged substantially in a line and any two of said plurality of solar cells being electrically connected in series by one of said interconnectors;
an insulator on which said plurality of solar cell assembly series are arranged at predetermined gaps;
first connection lines that electrically connect some of said plurality of solar cell assembly series so that they are connected in series so as to form a first solar cell string; and
second connection lines that electrically connect remaining ones of said plurality of solar cell assembly series so that they are electrically connected in series so as to form a second solar cell string different from the first solar cell string,
wherein each solar cell of a first solar cell assembly series of said first solar cell string is arranged immediately adjacent to a corresponding one of each solar cell of a second solar cell assembly series of said second solar cell string,
wherein each solar cell of a second solar cell assembly series of said first solar cell string is arranged immediately adjacent to a corresponding one of each solar cell of a first solar cell assembly series of said second solar cell string,
wherein any two adjacent solar cells in the adjacent first and second solar cell assembly series have a potential difference that does not exceed a maximum output voltage V of each solar cell assembly series,
wherein the first solar cell string and the second solar cell string form substantially concentric loops such that subsequent solar cell assembly series of the first and second solar cell strings are formed immediately adjacent each other, and
wherein any two adjacent solar cells in the subsequent solar cell assembly series of the first and second solar cell strings have a potential difference that does not exceed a maximum output voltage V of each solar cell assembly series.

* * * * *